US006210494B1

(12) United States Patent
Cole et al.

(10) Patent No.: US 6,210,494 B1
(45) Date of Patent: Apr. 3, 2001

(54) HIGH TEMPERATURE ZRN AND HFN IR SCENE PROJECTOR PIXELS

(75) Inventors: Barrett E. Cole, Bloomington; James O. Holmen, Minnetonka; David K. Greenlaw, Fridley, all of MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/106,604

(22) Filed: Jun. 29, 1998

Related U.S. Application Data

(62) Division of application No. 09/057,734, filed on Apr. 9, 1998.

(51) Int. Cl.[7] .................................................... C23C 14/06

(52) U.S. Cl. ...................... 148/237; 148/537; 204/192.21

(58) Field of Search .................................... 148/220, 237, 148/537; 204/192.17, 192.21

(56) References Cited

U.S. PATENT DOCUMENTS

| | | | |
|---|---|---|---|
| 3,647,662 * | 3/1972 | Gerstenberg et al. | 204/192.21 |
| 5,077,563 | 12/1991 | Takeuchi et al. | 346/76 PH |
| 5,286,976 | 2/1994 | Cole | 250/349 |
| 5,600,148 | 2/1997 | Cole et al. | 250/495.1 |
| 5,610,637 | 3/1997 | Sekiya et al. | 347/10 |
| 5,657,060 | 8/1997 | Sekiya et al. | 347/15 |
| 5,665,209 * | 9/1997 | Byun | 204/192.17 |

FOREIGN PATENT DOCUMENTS

| | | | |
|---|---|---|---|
| 0844806A | 5/1998 | (EP) . | |
| 61-127101 * | 6/1986 | (JP) | 204/192.21 |

OTHER PUBLICATIONS

Coleb, et al. "512 x 512 Infrared Cryogenic Scene Projector Arrays" Sensors and Acturators A, CH, Elsevier Sequoia S.A., Lausanne, vol. A48, No. 3, May 30, 1995, ISSN: 0924–4247 Whole Document.

Article entitled "Electrically Heated Pixel (EHP) Arrays for Dynamic Infrared Scene Generation" by A. P. Pritchard and S. P. Lake; British Aerospace plc, Sowerby Research Centre (FPC 267); Filton, Bristol, BS12 7QW UK; pp. 182–188 from the SPIE vol. 940 Infrared Scene Simulation: Systems, Requirements, Calibration, Devices, and Modeling (1988).

Article entitled"A High Fill Factor Suspended Resistor IR Scene Generator: Design, Fabrication and Preliminary Performance" by A. P. Pritchard, M. C. Hebbron, S. P. Lake and I. M. Sturland; British Aerospace plc Sowerby Research Centre, FPC 267 Filton Bristol BS12 7 QW UK; pp. 15–26 from SPIE vol. 1967.

Article entitled "Infared Scene Displays and Their Use in Detector and Processor Assesment" by A. D. Hart, A. P. Pritchard and S. P. Lake; Sowerby Research Centre, Naval Weapons Division, British Aerospace P.L.C., PO Box 5, Filton, Bristol, Great Britian; pp. 153–158 from Infrared Phys. vol. 27, No. 3, 1987.

(List continued on next page.)

*Primary Examiner*—George Wyszomierski
(74) *Attorney, Agent, or Firm*—John G. Shudy, Jr.

(57) ABSTRACT

A structure and method of making resistive emitting members which exhibit high resistivity while at the same time providing high temperature operation significantly above that known in the art. Specifically the use of nitrides of Group IVB transition metals from the periodic table, exclusive of titanium is described.

4 Claims, 5 Drawing Sheets

OTHER PUBLICATIONS

Article entitled "Dynamic Infrared Scene Projector For Missile Seeker Simulation" by W. S. Chan, J.S. Shie, C. H. Wang, V. K. Raman, Y. C. Chou, T. Karunasiri and R. Frenzel; Electro–Optek Corporation; 3152 Kashiwa St., Torrance, CA 90505; pp. 250–255 from Computer Simulation and SPIE, Orlando, FL (1991).

Article entitled "512x512 Infrared Scene Projector Array for Low Background Simulations" by B. E. Cole, C. J. Han, R. E. Higashi, J. Ridley, J. Holmen, J. Anderson, D. Nielsen, H. Marsh, K. Newstrom and C. Zins; Honeywell Technology Center; 10701 Lyndale Ave. S., Bloomington, MN 55420.

Article entitled "Recent Progress in Large Dynamic Resistor Arrays" by B. Cole, R. Higashi, J. Ridley, J. Holmen, and E. Benser; Honeywell Technology Center, 12001 State Highway 55, Plymouth, MN 55441; R. Stockbridge and L. Murrer; Wright Laboratory/MNGI, 101 West Eglin Boulevard, STE 309, Elgin AFB, FL 32542; L. Jones; Science Applications International Corp., 1247–B North Elgin Parkway, Shalimar, FL 32579 and E. Burroughs; RTTC, STERT–TE–E–SA Bldg. 4500, Redstone Arsenal, AL 35898; pp. 1–13 from SPIE 1997.

Article entitled "Dynamic IR Scene Generation: Basic Requirements and Comparative Display Device Design" by A. P. Pritchard; Sowerby Research Centre, British Aerospace plc, FPC 267, Filton, Bristol BS12 7QW, UK; pp. 14–149 from SPIE vol. 940 Infrared Scene Simulation: Systems, Requirements, Calibration, Devices and Modeling (1988).

* cited by examiner

HIGH TEMPERATURE ZRN AND HFN IR SCENE PROJECTOR PIXELS

This application is a divisional of Ser. No. 09/057,734 filed Apr. 9, 1998.

The United States Government has acquired certain rights in this invention pursuant to Contract No. F08630-93-C-0081 awarded by the Department of the Air Force.

BACKGROUND OF THE INVENTION

The present invention relates to ohmic heating elements, and more particularly to emission of thermal energy from refractive metal compounds resistive members. The present invention finds particular application for the production of infrared (IR) or thermal images from tightly packed pixel elements formed from these materials.

A major challenge in resistive IR emitter array technology is to produce a high emittance structure that requires relatively little electrical current during operation. The key factors which contribute to high emittance are the density of the pixels which form the array, and the maximum operating temperature of the pixels. High pixel density has been achieved in the prior art using a multi-level pixel structure. The multi-level pixel structure maximizes the radiating area by placing the pixel drive and addressing electronics directly under the a resistive emitting member. High radiance is achieved by fabricating the resistive emitting member of the pixel using a thin, absorbing film, and placing a reflector below this film to direct radiation outward.

The electrical current used by a thermal emitting pixel is strongly linked to the material used to form its resistive emitting member. In prior art systems the designer traded off low current operation for high temperature operation or compromised on other pixel characteristics. For example, metal films used for the resistive member such as platinum, although potentially having good high temperature properties, do not have high resistivities. Thus, platinum resistive members must be patterned into an extremely thin serpentine film to maximize their resistance. Unfortunately, the adhesion of these platinum films is poor, making the pixel structurally weak.

Titanium nitride is another material which has been used to form resistive members in thermal emitters. Titanium nitride has good temperature properties, satisfactory resistance and structural properties, but unfortunately involves sensitive pixel fabrication steps. Specifically, an annealing is typically done during processing of the thermal emitter to stabilize the device for high temperature operation. The resistance of titanium nitride varies considerably in the range of temperatures used for this anneal. This sensitivity can lead to large variations in pixel resistance from array to array and possibly large variations in emmisivity from pixel to pixel in the same array. In fact, the range of resistance of the titanium nitride resistor can in some cases cause pixels to become inefficient or completely inoperative. Titanium nitride resistive members also suffer from some difficulty with lifetime high temperature stability.

SUMMARY OF THE INVENTION

The present invention solves these and other needs by providing materials to fabricate resistive emitting members which exhibit high resistivity while at the same time providing high temperature operation significantly above that known in the art. Specifically, the use of nitrides of Group IVB transition metals from the periodic table, exclusive of titanium, and having a resistance greater than 50 ohms per square, is described.

The chosen resistive member materials are capable of operating at temperatures in excess of 1000K, and also result in other desirable properties for ohmic heating elements or arrays of such elements—high dynamic range of resistivities, controllable annealing properties at high temperatures, high temperature stability, improved control of resistive properties, improved optical properties, and a low positive thermal coefficient of resistance. The chosen resistive member materials are suitable for use in current high pixel density structures, and thus the applicants' invention may be applied to current thermal emitter fabrication techniques.

While there is literature which describes very high temperature materials for use as IR pixel arrays, (i.e., in the 1000K range), typically these devices exhibit low pixel density. One such device is described in: "Dynamic Infrared Scene Projector for Missile Seeker Simulation", W. S. Chan, et al., Proceedings of the 1991 International Simulation Technology Conference, Oct. 21–23 1991, pp. 250–255. The low pixel density leads to an array of very hot pixels with cooler inter-pixel regions. The ideal resistive member material should allow for a high pixel density without sacrificing the desired high temperature operation—that is, operation at temperatures in excess of 1000K.

While the chosen materials find particular use for thermal emitting elements (i.e. to produce thermal images), they also find use as heating elements either singularly or as arrays. Typically, when used in this manner, the resistive member is placed in physical contact with the material be heated.

DETAILED DESCRIPTION

Figure 1:
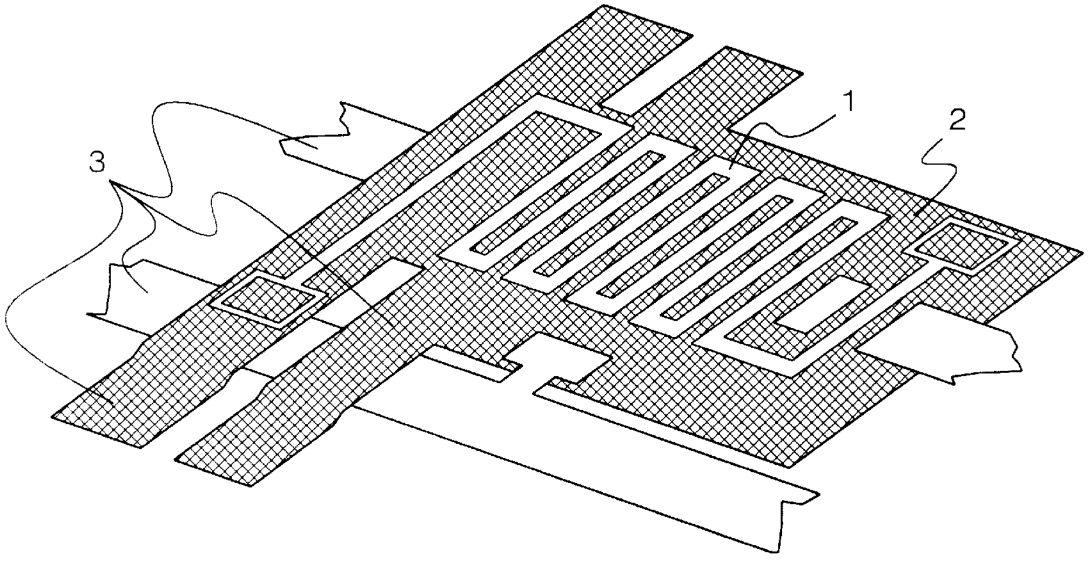
FIG. 1 shows a schematic representation of one structure optimized for thermal emittance, and adaptable for use with hafnium nitride and zirconium nitride resistive members.

FIG. 1 shows a typical design for a single thermal emitting element (i.e., pixel) for use in an array of pixels suitable for ohmic heating, and more particularly suitable for production of thermal images. A resistive emitting member 1 rests on a silicon nitride bridge or reflector member 2 which may also serve as a thermally isolating member. Resistive member 1 is typically, but not necessarily, a long serpentine film (as shown) to maximize its resistance. The serpentine shape is combined with thin films (approx. 500 angstroms) having milliohm centimeter resistivities to create pixel resistances of 10K ohms to 100K ohms. For course, the serpentine form may be replaced with a restive sheet or other structure if more desirable in a particular circumstance.

Signal and power lines 3, in conjunction with a current controlling means—buried under bridge member 2—operate the pixel, causing it to emit thermal energy, usually in concert with other pixels in the array. While in simplest form, the current controlling means provides binary (i.e. on-off) control of the pixel, typically, the pixel structure is designed to allow the pixel to emit thermal energy at a number of different levels when the current is varied in a selected operating range. For example, if the current controlling device is a MOS device, the current may be controlled by supplying one of a number of gate voltages, each gate voltage resulting in a different pixel temperature. In this way, a user-selected thermal image may be created with the array of pixels.

The initial value for the resistance of the resistive member is set by doping the resistive member with a material such as nitrogen. The resistance of the resistive member increases with increased nitrogen concentrations. One typical way of adding nitrogen is to sputter the pixel with nitrogen in a inert atmosphere such as argon. While for the remainder of this application, nitrogen will be used as the doping material, it is to be understood that other doping materials are possible, and may be selected based on specific design needs.

For a detailed description of the fabrication of the pixel structure such as that depicted in FIG. 1, reference is made to U.S. Pat. No. 5,600,148 to Cole et al. assigned to the assignee of the present invention and issued on Feb. 4, 1997, which is hereby incorporated by reference. Of course, the referenced fabrication technique is one of several which may be used, and is simply given as one example.

Figure 2A:
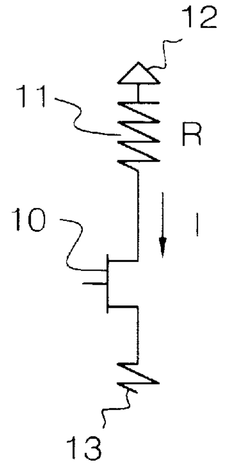
FIG. 2*a* shows one possible schematic diagram for a thermal emitting element of the present invention.
Figure 2B:
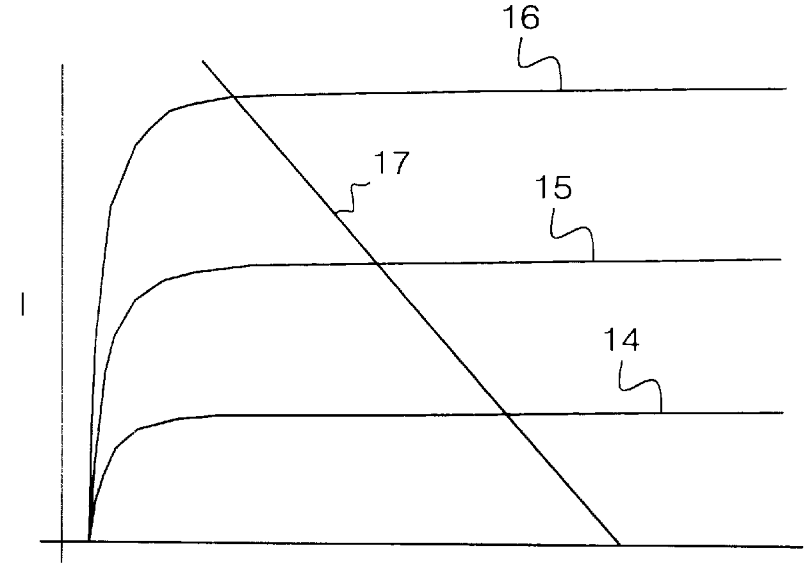
FIG. 2*b* shows several I-V (current v. voltage) curves for a MOS device used in a thermal emitting element applicable to the current invention.

FIG. 2*a* shows one possible implementation of the pixel electronics. A MOS device 10, serving as the current controlling means, is connected in series with resistive member 11 between two power terminals 12 and 13. Resistive member 11 comprises the resistive emitting member 1, the composition of which is the subject of the present invention. Three hypothetical characteristic curves, labeled 14, 15, and 16, for MOS device 10 are shown in FIG. 2*b*. Each curve includes an active region (left-most curved, and semi-vertical portions) and a saturation region (mostly horizontal portions). As is known, each curve 14, 15 and 16 represents a different gate voltage for MOS device 10. For $I^2R$ (i.e. resistive) heating of the pixel, the current through MOS device 10 and thus through resistive member 11, is roughly proportional to the pixel temperature. Each characteristic curve is therefore associated with the pixel at a different temperature. In operation, the user creates a thermal image by selecting different gate voltages for different pixels to achieve the desired thermal image.

The exact relationship between current and temperature of the pixel is given by:

$$T=P/G_{PIX}+T_{sub}, \quad (1)$$

where $T$=pixel temperature, $P$=Power consumed, $T_{sub}$=temperature of the substrate, and $G_{PIX}$=Thermal Conductivity of Pixel to Substrate.

To achieve the maximum temperature for a pixel requires maximization of this equation. Assuming $G_{PIX}$ and $T_{sub}$ factors have been optimized using other design criteria, pixel temperature may be maximized by maximizing power consumption for the pixel. The power, P, is described by:

$$P=I^2R, \quad (2)$$

where

R=emitting element resistance, and

I=current through the resistive member.

Since we typically also want to use as little current as possible for thermal emitters (to prevent overheating of the substrate), power should be maximized by maximizing the resistance of the resistive member 11 during pixel fabrication. The slope of diagonal line 17 in FIG. 2*b* represents the resistance value of resistive member 11. For optimal operation, diagonal line 17 should cross the MOS characteristic curve slightly above the active region. Typically, the amount above the active region is about 1 volt, as this prevents the pixel from falling in to the saturation region if there are variations in pixel array voltage. This location for the resistor line maximizes resistance and thus temperature of the resistive member 11, since the slope of the line represents the resistance of resistive member 11.

For purposes of the following discussions, it is noted that during fabrication of the resistive member 11, an annealing step occurs which stabilizes the pixel for high temperature operation. To some extent, the annealing step may also be used to adjust the resistance of resistive member 11. The annealing is done by passing current through the pixel at sufficient levels to cause the pixel to reach the desired anneal temperature. The temperature to which the resistive member is annealed determines, at least in part, the operating range of the pixel, and also some of its physical characteristics.

Figure 3:
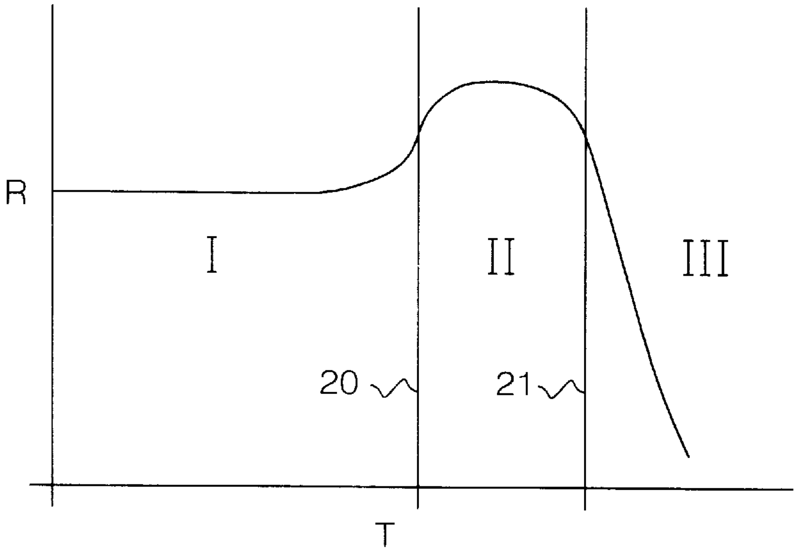
FIG. 3 shows hypothetical annealing properties for a titanium nitride resistive member.

A short discussion of the annealing of a titanium nitride resistive member will be instructive for purposes of this application, and thus follows. As indicated earlier, titanium nitride is one possible resistive member material used in the prior art. FIG. 3 shows a hypothetical graph of resistance versus temperature for a titanium nitride resistive member. The location of the curve in the graph shown will vary significantly depending on the nitrogen content of the resistive member and other fabrication factors. The general characteristics of the graph will not change however. In the graph shown, two dark vertical bars, labeled 20 and 21 represent one possible design choice for the upper and lower boundaries, respectively, of the practical annealing range for a titanium nitride resistive member. For future reference, the region below line 20 has been labeled I, and the region above line 21 has been labeled III. The region between lines 20 and 21 is labeled II.

In one possible method of annealing, the designer attempts to heat the pixel to a desired temperature falling within region II. For most materials, if the pixel is not annealed above vertical bar 20 (region I), the pixel will not have a useful operating temperature range. As one of skill in the art is aware, the resistive member could not be operated above the anneal temperature, since operation above that temperature for any length of time would essentially cause the resistive member to further anneal during operation. High temperature operation requires operation at least into region II for high resistance materials. To the right of vertical bar 21 (region III), the pixel's resistance will be difficult to control since resistance drops sharply with increased temperature, and also would not represent the maximum possible resistance capable for the pixel.

Achieving the proper resistance for the resistive member is complicated by non-uniform temperatures across all the pixels during anneal caused by variations in pixel current, pixel resistance and pixel conductance. A material such as titanium nitride with a steep sloping transition from region II to region III makes annealing into region III unattractive. In fact, to prevent accidental annealing into this region III, the designer will typically add a margin of safety before region III, further decreasing the anneal temperature and thus operating range of the pixel.

The increase in resistance from region I of the graph of FIG. 3 to region II of the graph also complicates the anneal process for titanium nitride pixels. During the anneal, resistive heating of the pixel will move the resistor along its temperature curve shown in FIG. 3. Referring back to FIG. 2*b*, during the annealing process when the resistive member moves from region I to region II, the upper end of resistor line 17 will move to the left. If this causes the MOS device to fall into the active region, it may become impossible to supply enough current to anneal the pixel further. This could make the pixel ineffective or inoperative as an emitting element. For this reason, the designer must typically adjust the initial position of resistor line 17 for a titanium nitride pixel even further to the right of its optimal position (using a higher nitrogen concentration), so that the resistor line never moves far enough to the left to enter the active region of the MOS curve.

As another design option, the nitrogen content of the pixel may be used to place line 20, and thus region I of the graph of FIG. 3, above the desired operating range. While this technique avoids the problem associated with annealing into region II, it unfortunately involves concentrations of nitrogen which make the resistance unacceptably low for some designs.

The applicants' have focused their attention on avoiding the difficulty caused by rapidly changing annealing curves such is evidenced by titanium nitride (i.e between regions I and II and in region III). What the applicant's discovered was a number of materials which have relatively flat characteristics throughout the anneal range, and also exhibit other desirable characteristics.

Specifically, the applicants have discovered that unlike titanium nitride, hafnium nitride (HfN) and zirconium nitride (ZrN) are relatively stable over the required annealing range, and thus may serve as excellent materials for resistive member 11. Furthermore, HfN and ZrN resistive members are formed at much lower nitrogen concentrations. Low nitrogen concentrations create a physically and electronically stronger resistor structure. Devices having resistive members including these materials are also less susceptible to environmental changes.

Figure 5:
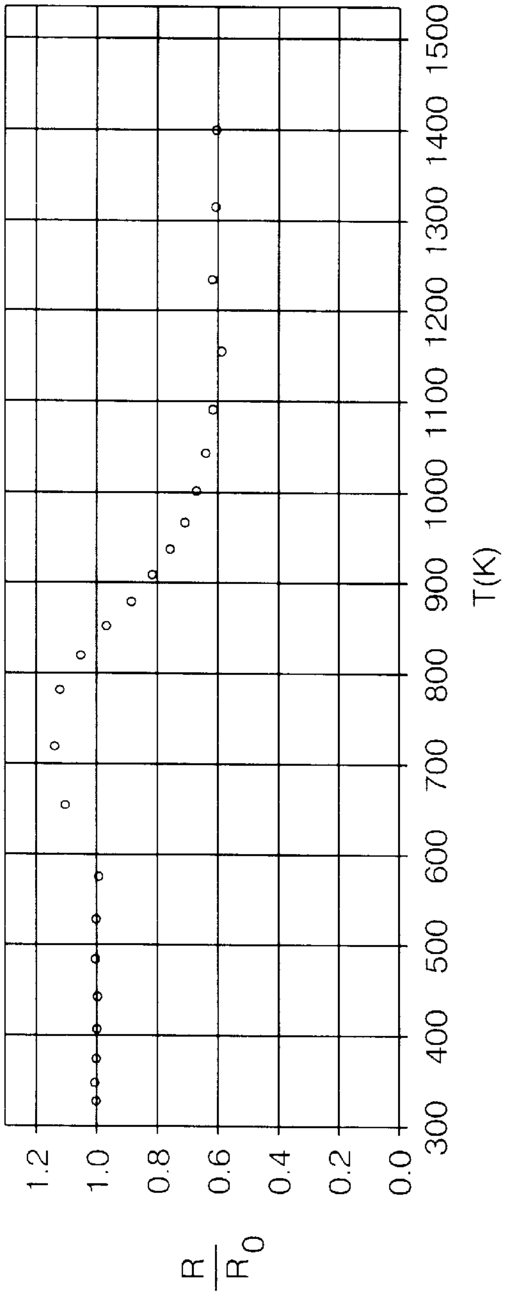
FIG. 5 shows the annealing properties for a zirconium nitride resistive member.
Figure 4:
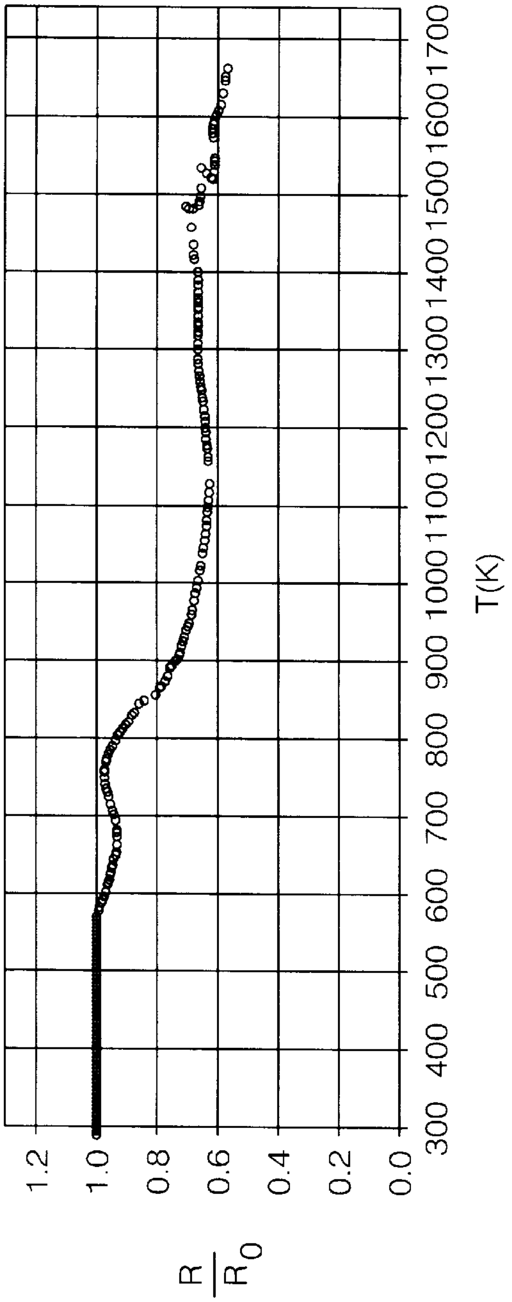
FIG. 4 shows the annealing properties for a hafnium nitride resistive member.
Figure 6:
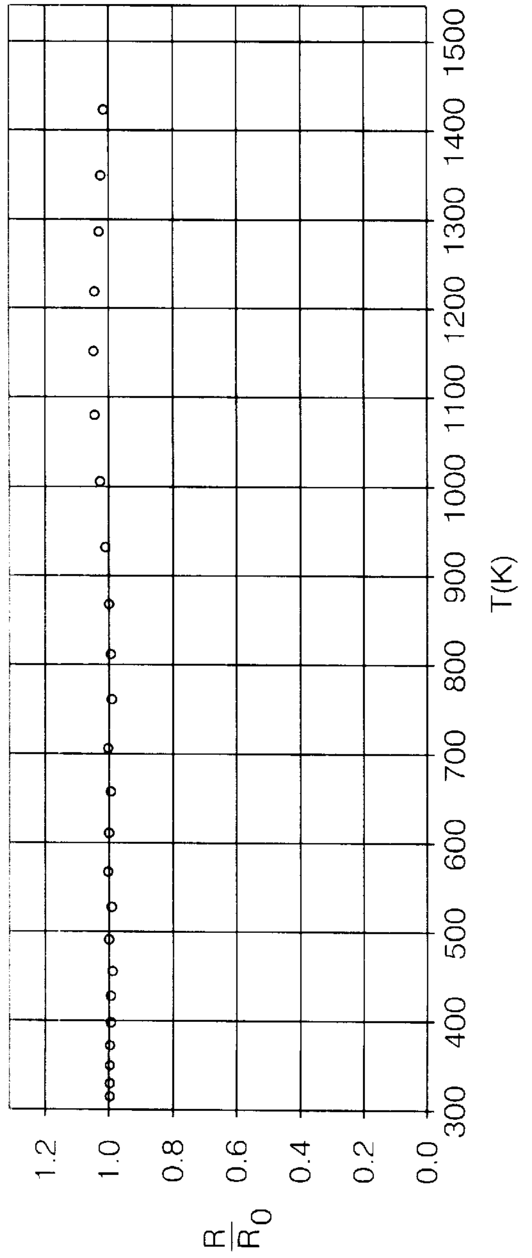
FIG. 6 shows the temperature stability for a zirconium nitride resistive member subsequent to annealing.

The applicants' intended materials for the resistive member may be classified as Group IVB transition metals of the Periodic Table, having forty or more valence electrons. FIG. 4 shows a temperature verses resistance curve for a hafnium nitride resistive member, and FIG. 5 shows a similar curve for a zirconium nitride resistive member. Neither graph shows a sharp drop in resistance during the upper annealing range, or an initial increase in resistance indicated for Titanium nitride resistive members shown in FIG. 3.

Since there is no higher upper boundary on annealing temperature for the resistive member, there is consequently more flexibility and latitude in the exact temperature of the anneal and in general pixel design. In addition, for low temperature operation, the resistive member shows little or moderate resistance range. This eases the task of annealing because the designer need not worry about the device becoming inoperable during the anneal, such as would be caused by changes in the resistor value pushing the MOS switching member into the active region of operation. Effectively, the hafnium and zirconium nitride exhibit no or minimal transition between what was regions I and II of FIG. 3, or the sharp slope of region III of FIG. 3.

For a hafnium nitride resistive member having nitrogen concentrations of about 10%, as can be seen in FIG. 4, resistance decreases from 800 to 1000 Kelvin and then stabilizes at a constant value. Annealing performed to just beyond 1000 Kelvin produces a temperature stable device. In the case of a zirconium nitride resistive member having a nitrogen concentration of about 10%, as shown in FIG. 5, a sloping region ends at 1000 Kelvin, requiring annealing be done to at least 1000 Kelvin to produce a device with good high temperature stability. Of course, like titanium nitride resistive members, the specific annealing temperatures will shift depending on nitrogen content of the resistive member or other factors.

Graph 6 shows the resistance vs. temperature for a zirconium nitride resistive member subsequent to annealing. As the graph shows, an annealed resistive member will have a constant, stable resistance to the anneal temperature. For the purposes of this application, resistance temperature stability for the resistive members is defined as less then five percent change in resistance over the operating range of the pixel. A similar graph for hafnium nitride, would also show temperature stability. A similar graph for titanium nitride however, would show loss of temperature stability just above the temperature to which the anneal was performed.

Figure 7:
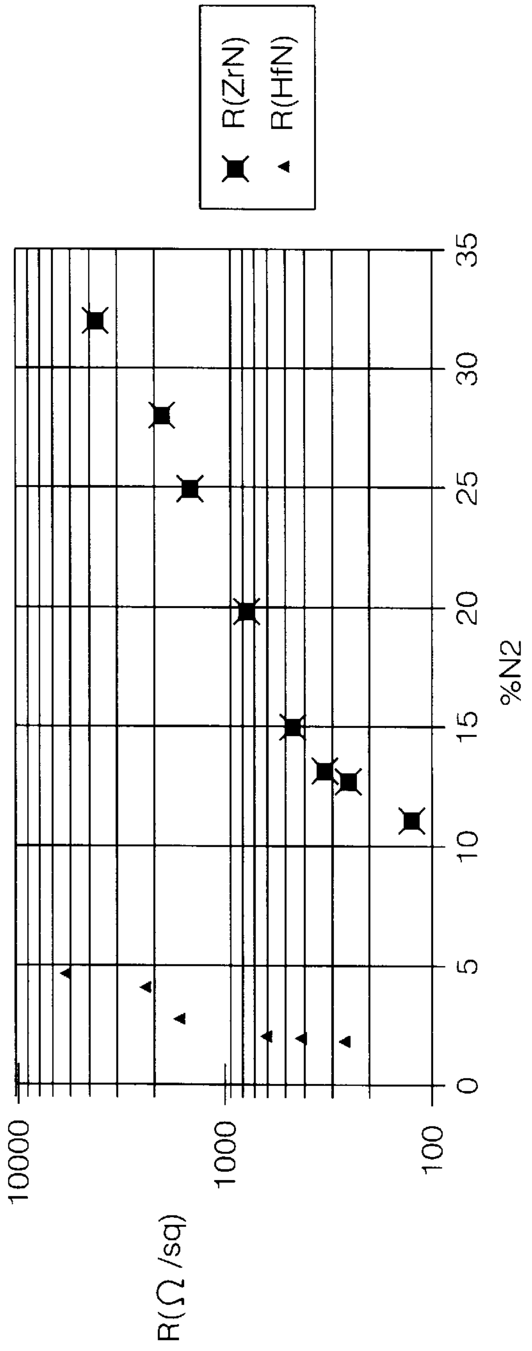
FIG. 7 shows the nitrogen content vs. resistance properties for zirconium nitride and hafnium nitride resistive members.

Generally hafnium nitride and zirconium nitride resistive members operate similarly. There are, however, some differences between these two materials. FIG. 7 shows a graph of the resistance of each material for changes in nitrogen content during fabrication. A resistive member containing hafnium nitride is much more sensitive to nitrogen content than one containing zirconium nitride. This increases the difficulty of the fabrication process for hafnium nitride, and somewhat for zirconium nitride, since tiny nitrogen content changes cause large resistance changes in the resistive member. Hafnium nitride may be chosen over zirconium nitride, despite its heightened sensitivity, if higher resistive values are desired. As can be seen from the graph of FIG. 7, a much higher resistance may be achieved using hafnium nitride with a smaller amount of nitrogen, and this may decrease processing time significantly as well as improving pixel strength. Zirconium nitride may be more suitable where exact resistance is more important than a very high resistance value. While exact values for resistance will vary depending on the reader's design criteria, for high temperature operation, nitrogen content for hafnium nitride resistive members would be approximately below ten percent for high temperature operation. Zirconium nitride resistive members should be in the ten to forty percent nitrogen range for high temperature operation. In both cases, the identified nitrogen concentrations will result in a resistance of above about 50 ohms per square for the resistive members.

During pixel fabrication, films of the resistive member material are typically formed by sputtering Hafnium and Zirconium metals in the presence of a reactive gas, such as nitrogen, and an inert sputtering gas. For both hafnium and zirconium nitride resistive members, the nitrogen content must be critically controlled when it is deposited. The applicant's have found that the best way to provide a uniform atmosphere of gas at the proper nitrogen content levels during fabrication has been to dilute the nitrogen gas with a much larger portion of carrier gas prior to sputtering. The dilution is typically at one part nitrogen to ten parts carrier gas. This carrier gas mixed with the reactive gas is then supplied to the sputtering chamber in addition to the regular supply of sputtering gas supplied to the chamber. The sputtering gas is typically, but need not be, the same as the carrier gas. Thus, the total nitrogen concentration during sputtering is between zero and five percent of the total sputtering gas. Ten parts carrier gas to one part nitrogen has been found to produce satisfactory results in the applicant's pixel fabrication process, although higher or lower concentrations may be possible based on the equipment or design used. The applicant's preferred carrier gas is Argon due to its inert properties during resistive member processing and usefulness as a sputtering gas.

In any event, the low concentration of nitrogen in a carrier gas corrects for some problems caused by mass flow meters which will not operate at the needed low nitrogen flow rates absent the carrier gas. The suggested technique also produces a more uniform nitrogen concentration during the deposition. It is contemplated that use of the carrier gas may be reduced or eliminated when new technology or techniques for proper control of nitrogen flow develop.

Figure 8:
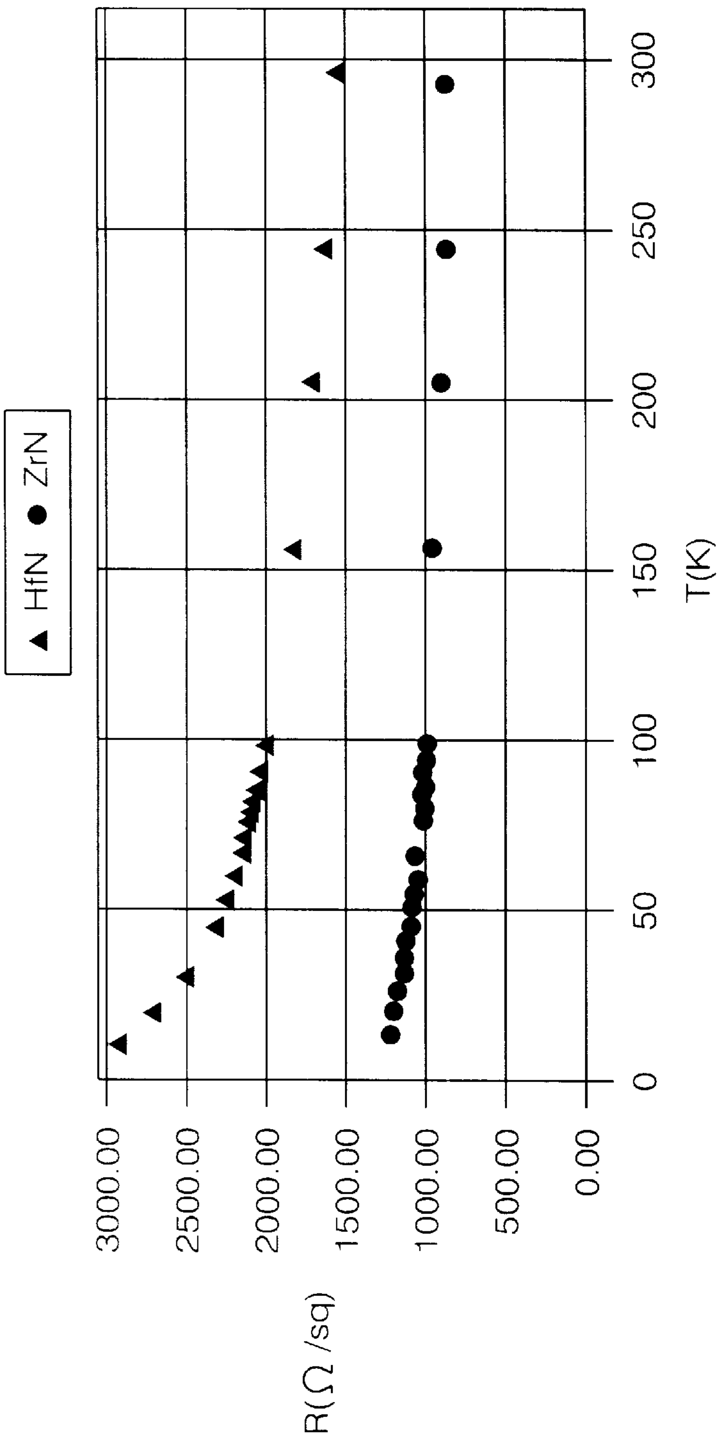
FIG. 8 shows the cryogenic properties for zirconium nitride and hafnium nitride resistive members.

Both hafnium and zirconium nitride are suitable for use at ambient and cryogenic temperatures. FIG. 8 shows the characteristic resistance of a typical pixel over a temperature range from 20K to 300K. Both materials exhibit relative stability at these cryogenic levels. It is also noted that both of the materials exhibit a small positive thermal coefficient of resistance which is beneficial in preventing thermal runaway for current driven heating such as in the case in the pixel scheme shown in FIG. 1.

It is to be understood that the invention is not limited to the exact construction or methods illustrated and described above, but that various changes and modifications may be made without departing from the spirit and scope of the invention. For example, rather than being used for thermal emitters, the resistive members may be used as heating elements either individually or as an array. When used in this manner, the resistive member or elements will typically be placed in contact with the material to be heated. A person skilled in the art will recognize further variations that fall within the spirit and scope of the present invention as defined by the following claims.

What is claimed is:

1. A method of producing an element of an ohmic heating array comprising:

a) applying a resistive member over a thermally isolating member, said resistive member being comprised of nitrides of Group IV B Transition Metals of the periodic table having 40 or more valence electrons, said resistive member being sputtered onto said thermally isolating member in the presence of nitrogen gas and an inert carrier gas, where the ratio of carrier gas to nitrogen gas is approximately ten to one; and b) annealing said resistive member by heating through a desired operating range of said element to a temperature above about 1000 K so that the final resistance of said resistive member exceeds about 50 ohms per square.

2. The method of claim 1 wherein said resistive member comprises hafnium.

3. The method of claim 1 wherein said resistive member comprises zirconium.

4. The method of claim 1 wherein said carrier gas is argon.

* * * * *